US012810933B2

(12) United States Patent
Shin et al.

(10) Patent No.: US 12,810,933 B2
(45) Date of Patent: Nov. 24, 2026

(54) MEMORY DEVICE PERFORMING SELECTIVE REWRITE BASED ON READ RESULT, DATA STORAGE DEVICE INCLUDING THE SAME AND METHOD OF OPERATING THE SAME

(71) Applicant: SK hynix Inc., Gyeonggi-do (KR)

(72) Inventors: Young Kyun Shin, Gyeonggi-do (KR); Taek Seung Kim, Gyeonggi-do (KR); Gap Sok Do, Gyeonggi-do (KR); Seung Yun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/823,694

(22) Filed: Sep. 4, 2024

(65) Prior Publication Data

US 2025/0279139 A1 Sep. 4, 2025

(30) Foreign Application Priority Data

Feb. 29, 2024 (KR) ........................ 10-2024-0029991

(51) Int. Cl.
*G11C 13/00* (2006.01)

(52) U.S. Cl.
CPC ...... *G11C 13/0069* (2013.01); *G11C 13/0026* (2013.01); *G11C 13/0028* (2013.01);
(Continued)

(58) Field of Classification Search
CPC ............ G11C 13/0069; G11C 13/0097; G11C 13/0028; G11C 13/004; G11C 13/0026; G11C 2213/30
See application file for complete search history.

(56) References Cited

U.S. PATENT DOCUMENTS

2018/0174652 A1* 6/2018 Terada .................... G06F 12/00
2019/0043580 A1* 2/2019 Pirovano ................ H10B 63/80
(Continued)

FOREIGN PATENT DOCUMENTS

KR 10-2021-0112235 A 9/2021

OTHER PUBLICATIONS

Taras Ravsher et al., Enhanced performance and low-power capability of SiGeAsSe—GeSbTe 1S1R phase-change memory operated in bipolar mode, 2022 IEEE Symposium on VLSI Technology and Circuits (VLSI Technology and Circuits), Jun. 12-17, 2022, pp. 312-313, IEEE.
(Continued)

*Primary Examiner* — Mark A Giardino, Jr.
(74) *Attorney, Agent, or Firm* — IP&T GROUP LLP

(57) ABSTRACT

Provided herein may be a data storage device. A memory device may include a plurality of memory cells; and an operation controller configured to control a word line controller and a bit line controller so that a normal write operation of applying a write voltage corresponding to a target state that is one of a set state and a reset state to the plurality of memory cells is performed, and a rewrite operation is selectively performed based on a result of the normal write operation. The rewrite operation may be an operation of providing, to the plurality of memory cells, a select voltage, having a polarity opposite to a polarity of the write voltage corresponding to the target state, and providing the write voltage corresponding to the target state.

16 Claims, 9 Drawing Sheets

(52) U.S. Cl.
CPC ........ *G11C 13/004* (2013.01); *G11C 13/0097* (2013.01); *G11C 13/0004* (2013.01); *G11C 2213/30* (2013.01)

(56) References Cited

U.S. PATENT DOCUMENTS

| | | | | |
|---|---|---|---|---|
| 2019/0050285 | A1* | 2/2019 | Lin | G06F 11/1048 |
| 2019/0206489 | A1* | 7/2019 | Wang | G11C 13/0004 |
| 2022/0108732 | A1 | 4/2022 | Boniardi et al. | |
| 2023/0168811 | A1* | 6/2023 | Okada | G06F 3/0647<br>711/103 |
| 2023/0395135 | A1* | 12/2023 | Bedeschi | G11C 16/28 |
| 2024/0331769 | A1* | 10/2024 | Pries | G11C 13/0069 |
| 2025/0210084 | A1* | 6/2025 | Saenz | G11C 11/1673 |

OTHER PUBLICATIONS

Taras Ravsher et al., Polarity-dependent threshold voltage shift in ovonic threshold switches: Challenges and opportunities, 2021 IEEE International Electron Devices Meeting (IEDM), Dec. 11-16, 2021, pp. 613-616, IEEE.

D. Matsubayashi et al., OTS Physics-based Screening for Environment-friendly Selector Materials, 2022 IEEE International Electron Devices Meeting (IEDM), Dec. 3-7, 2022, pp. 190-193, IEEE.

* cited by examiner

Set Write

Reset Write

MEMORY DEVICE PERFORMING SELECTIVE REWRITE BASED ON READ RESULT, DATA STORAGE DEVICE INCLUDING THE SAME AND METHOD OF OPERATING THE SAME

CROSS-REFERENCE TO RELATED APPLICATION

The present application claims priority under 35 U.S.C. § 119(a) to Korean patent application number 10-2024-0029991 filed on Feb. 29, 2024, the entire disclosure of which is incorporated by reference herein.

BACKGROUND

1. Field of Invention

Various embodiments of the present disclosure generally relate to a data storage device and a method of operating the data storage device, and more particularly to a data storage device having improved write operation performance and a method of operating the data storage device.

2. Description of Related Art

A data storage device may include a memory device which stores data and a controller which controls the memory device. Memory devices may be a volatile memory device or a nonvolatile memory device. The volatile memory device may lose data stored therein when supply of power is interrupted, and the nonvolatile memory device may retain stored data even when the supply of power is interrupted. Each of the memory cells included in a memory device may have a certain logic state depending on the physical/chemical characteristics of a material forming the memory cells included in the memory device. A nonvolatile memory device including memory cells containing a chalcogenide material may have the characteristics of operating slower than a dynamic random access memory (DRAM), but having capacity (integration) larger than that of the DRAM; and of having capacity (integration) smaller than that of a NAND flash memory, but operating faster than the NAND flash memory.

SUMMARY

Various embodiments of the present disclosure are directed to a data storage device including a memory device having improved write operation performance and a method of operating the data storage device.

An embodiment of the present disclosure may provide for a memory device including a plurality of memory cells; and an operation controller configured to perform control so that a normal write operation of applying a write voltage corresponding to a target state that is any one of a set state and a reset state to the plurality of memory cells is performed, and a rewrite operation is selectively performed based on a result of the normal write operation. The rewrite operation is an operation of providing, to the plurality of memory cells, a select voltage having a polarity opposite to a polarity of the write voltage corresponding to the target state, and providing the write voltage corresponding to the target state.

An embodiment of the present disclosure may provide for a data storage device. The data storage device may include a memory device including a plurality of memory cells. The memory device is configured to perform a normal write operation of writing data to the plurality of memory cells, and output a result of the normal write operation, and a controller configured to provide a rewrite command instructing the data to be rewritten to the memory device based on the result of the normal write operation. The memory device, in response to the rewrite command, may provide, to the plurality of memory cells, a select voltage having a polarity opposite to a polarity of a write voltage corresponding to a target state that is any one of a set state and a reset state, and provide the write voltage corresponding to the target state.

An embodiment of the present disclosure may provide for a memory device including a plurality of memory cells and an operation controller. The operation controller may perform a rewrite operation of providing, to the plurality of memory cells, a select voltage having a polarity opposite to a polarity of a write voltage corresponding to a target state that is any one of a set state and a reset state, and providing a write voltage corresponding to the target state.

An embodiment of the present disclosure may provide for a method of operating a data storage device. The method includes performing a normal write operation; sensing a result of the normal write operation; determining whether a number of off-cells included in the sensed result is greater than a reference number; and perform a rewrite operation in response to a determination that the number of off-cells is greater than the reference number. The rewrite operation is an operation of providing, to a plurality of memory cells, a select voltage having a polarity opposite to a polarity of a write voltage corresponding to a target state in the normal write operation, and providing the write voltage corresponding to the target state.

DETAILED DESCRIPTION

Specific structural or functional descriptions in the embodiments of the present disclosure introduced in this specification are provided as examples to describe embodiments according to the concept of the present disclosure. The embodiments according to the concept of the present disclosure may be practiced in various forms, and should not be construed as being limited to the embodiments described in the specification.

Hereinafter, various embodiments of the present disclosure will be described in detail with reference to the accompanying drawings in which embodiments of the present disclosure are shown so that those skilled in the art to which the present disclosure pertains can easily practice the technical spirit of the present disclosure.

Figure 1:
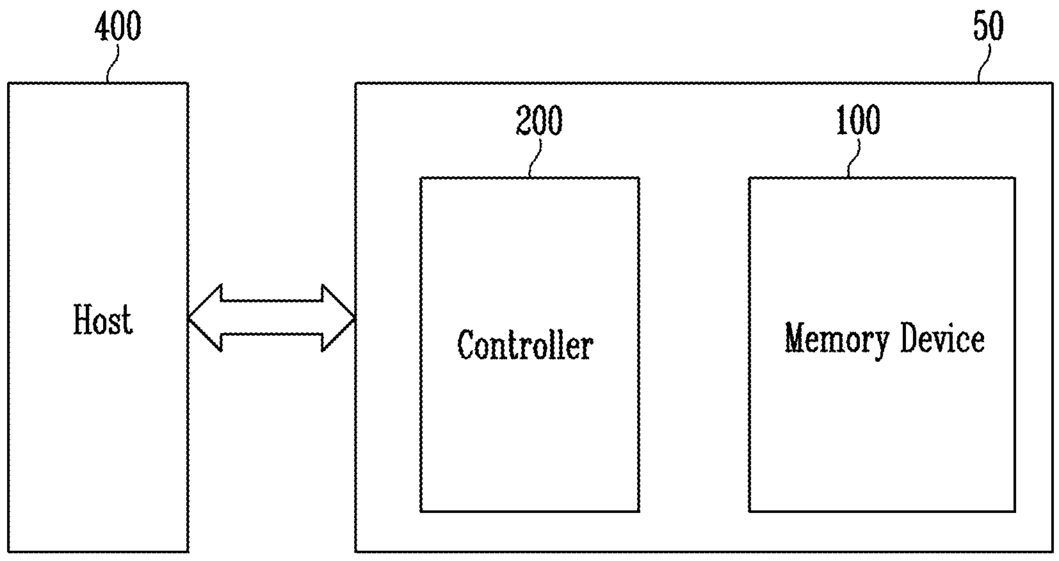
FIG. 1 is a diagram illustrating a configuration of a data storage device according to an embodiment of the present disclosure.

FIG. 1 is a diagram illustrating a configuration of a data storage device 50 according to an embodiment of the present disclosure.

Referring to FIG. 1, the data storage device 50 may include a memory device 100 and a controller 200. The data storage device 50 may be a device which stores data under the control of a host 400, such as a mobile phone, a smartphone, a laptop computer, a desktop computer, a game console, a smart television (TV), a tablet PC, or an in-vehicle infotainment system. In an embodiment, the data storage device 50 may be a device which stores data at a remote place, such as a server or a data center, and which is controlled by the host 400 through wired/wireless communication.

The data storage device 50 may interface with the host 400 through various communication methods, and may be implemented as various devices depending on the interfacing methods. For example, the data storage device 50 may be implemented as any of various types of storage devices, such as a solid state drive (SSD), an embedded multimedia card (eMMC), a SD, mini-SD, or micro-SD-type secure digital card, a universal serial bus (USB) storage device, a universal flash storage (UFS) device, a personal computer memory card international association (PCMCIA) card-type storage device, a peripheral component interconnection (PCI) card-type storage device, a PCI express (PCI-E) card-type storage device, a compact flash (CF) card, and a smart media card.

In an embodiment, the data storage device 50 may be manufactured in any of various types of package forms. For example, the data storage device 50 may be manufactured in any of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated under the control of the controller 200. The memory device 100 may include a plurality of memory cells which store data therein.

Each of the memory cells may store one data bit or a plurality of data bits.

The memory cells may be accessed in units of a preset size depending on the type of memory device. The units in which the memory cells are accessed may differ for respective operations. For example, the memory cells may be accessed in different size units for a write operation of storing data in each memory cell, a read operation of sensing data stored in each memory cell, and an erase operation of erasing data stored in each memory cell.

In an embodiment, the memory device 100 may be a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus DRAM (RDRAM), a NAND flash memory, a vertical NAND flash memory, a NOR flash memory, a resistive RAM (RRAM), a phase-change memory (PCM), a magnetoresistive RAM (MRAM), a ferroelectric RAM (FRAM), or a spin transfer torque RAM (STT-RAM).

Generally, the memory cells included in the memory device 100 form a memory cell array, which includes storage elements which store data and selectors which select the memory cells.

In a DRAM, a capacitor functions as a storage element, and a transistor functions as a selector. In a NAND flash memory, a transistor which selects memory cells in units of a string and functions as a selector.

The memory device 100 according to an embodiment of the present disclosure may include single cells, each including a chalcogenide-based material and two electrodes. In an embodiment, in the memory device 100, the chalcogenide-based material may also be referred to as a dual function material (DFM). The DFM may have a threshold voltage, as in the case of an ovonic threshold switching (OTS) material functioning as a selector in a phase-change memory (PCM).

The DFM is different from the OTS, the threshold voltage of which does not change, and the threshold voltage of the DFM may change during a bidirectional write operation. Such a change allows the DFM to be used as a memory cell, and the DFM may function as both a storage element and a selector through the bidirectional write operation. A memory device using the DFM may be a selector-only memory (SOM) device or a self-selecting memory (SSM) device.

In the present specification, description will be made based on that the memory device 100 is a type of phase-change memory including an SOM cell that is a memory cell containing the chalcogenide-based material.

The memory device 100 may receive a command and an address from the controller 200, and may access an area of the memory cell array, selected by the address. The memory device 100 may perform an operation indicated by the command on the area selected by the address. For example, the memory device 100 may perform a write operation (program operation), a read operation, and an erase operation. During a program operation, the memory device 100 may write data to the area selected by the address. During a read operation, the memory device 100 may sense data from the area selected by the address. During an erase operation, the memory device 100 may erase data stored in the area selected by the address.

The controller 200 may control the overall operation of the data storage device 50.

When power is applied to the data storage device 50, the controller 200 may run firmware (FW). The data storage device 50 may translate the address provided by the host 400 into an address used by the memory device 100.

The controller 200 may control the memory device 100 so that a write operation, a read operation or an erase operation is performed in response to a request received from the host 400. During the write operation, the controller 200 may provide a write command, an address, and data to the memory device 100. During the read operation, the controller 200 may provide a read command and an address to the memory device 100. During the erase operation, the controller 200 may provide an erase command and an address to the memory device 100.

In an embodiment, the controller 200 may independently generate a command, an address, and data regardless of whether a request from the host 400 is received, and may transmit them to the memory device 100. For example, the controller 200 may control the memory device 100 to perform various background operations for maintaining the performance of the memory device 100.

In an embodiment, the controller 200 may include an error correction code (ECC) processor. Alternatively, the ECC processor may be included, as a chip or a device separate from the controller 200, in the data storage device 50. The ECC processor may detect and correct errors contained in data obtained from the memory device 100 through a read operation. In an embodiment, the number of bits that can be corrected by the ECC processor may be limited.

Figure 2:
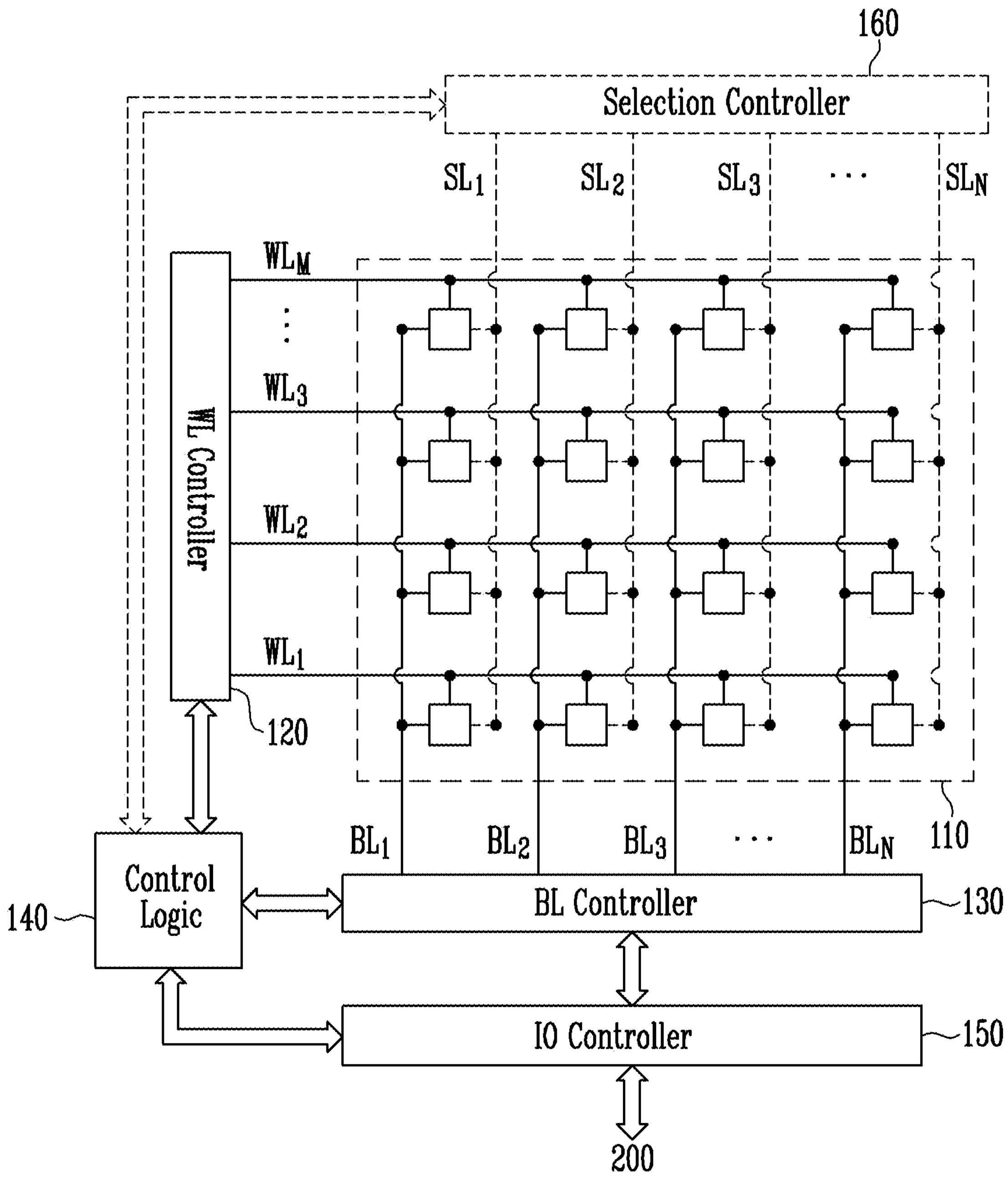
FIG. 2 is a diagram illustrating a detailed configuration of the memory device of FIG. 1, according to an embodiment of the present disclosure.

FIG. 2 is a diagram illustrating a detailed configuration of the memory device 100 of FIG. 1, according to an embodiment of the present disclosure.

Referring to FIG. 2, the memory device 100 may include a memory cell array 110, a word line (WL) controller 120, a bit line (BL) controller 130, a control logic 140, and an input/output (IO) controller 150. According to an embodiment, the memory device 100 may further include a selection controller 160. The selection controller 160 may be coupled to the memory cell array 110 through source lines SL1 to SLn.

The memory cell array 110 may include memory cells arranged at intersections of a plurality of word lines and a plurality of bit lines. Each memory cell may be coupled to one word line and one bit line. In an embodiment, each memory cell may contain a chalcogenide-based dual function material (DFM). The memory cell may store a logic state depending on the physical/chemical characteristics or attributes of the DFM. In an embodiment, the memory cell may be a SOM cell or a self-selecting memory (SSM) cell. In an embodiment, the memory cell may be in a set state or a reset state. The set state and the reset state may have opposite polarities. In an embodiment, the set state may represent logic “0” and the reset state may represent logic “1”. Alternatively, on the contrary, the set state may represent logic “1”, and the reset state may represent logic “0”. The logic state of the memory cell may be detected by a read operation. The logic state of the memory cell may be based on the polarity of voltage applied to a DFM forming the memory cell. In an embodiment, the logic state of the memory cell may be at least partially based on a direction of current applied to the memory cell or the polarity of voltage applied thereto during a write operation.

In the present specification, for convenience of description, the set state may be defined as a logic “1” state in which data “1” is stored, and the reset state may be defined as a logic “0” state in which data “0” is stored. In an embodiment, a memory cell in the set state may have a threshold voltage higher than that of a memory cell in the reset state.

The word line controller 120 may provide a word line voltage to memory cells included in the memory cell array 110 through a plurality of word lines WL1 to WLM coupled to the memory cells, respectively.

The bit line controller 130 may provide a bit line voltage to the memory cells included in the memory cell array 110 through a plurality of bit lines BL1 to BLN coupled to the memory cells, respectively.

In an embodiment, the bit line controller 130 may include a sense amplifier (Sense AMP) which senses pieces of data stored in the memory cells through the bit lines. The bit line controller 130 may include latches which store the sensed data.

The control logic 140 may control the word line controller 120 and the bit line controller 130 so that an operation can be performed on the memory cell array. Each of the word line controller 120 and the bit line controller 130 may provide a voltage to the memory cell array under the control of the control logic 140.

According to an embodiment of the present disclosure, a write operation in which the memory device 100 writes data to the memory cells may include a normal write operation and a rewrite operation.

The normal write operation may be a write operation of overwriting data desired to be written regardless of data stored in the corresponding memory cell. The following Table 1 shows the polarities of write voltages that are applied to a word line and a bit line of each memory cell during the normal write operation.

TABLE 1

| Target state | Bit line voltage | Word line voltage |
|---|---|---|
| set state | + | − |
| reset state | − | + |

According to Table 1, in order to write the set state to the memory cell, the control logic 140 may control the bit line controller 130 and the word line controller 120, respectively, to apply a positive voltage to the corresponding bit line and apply a negative voltage to the corresponding word line. On the other hand, in order to write the reset state to the memory cell, the control logic 140 may respectively control the bit line controller 130 and the word line controller 120 to apply a negative voltage to the corresponding bit line and apply a positive voltage to the corresponding word line.

In order to perform the normal write operation of writing data to a memory cell, a target memory cell needs to be selected, where selecting may refer to turning on the memory cell. Generally, the DFM of an SOM cell or an SSM cell has a drift characteristic which is a phenomenon in which the resistance of an amorphous chalcogenide material increases due to structural relaxation (i.e., defect reduction). Depending on the drift characteristic, the threshold voltage of the memory cell may increase. Generally, an increment in the threshold voltage depending on the drift characteristic may be larger as time is longer and temperature is higher, and may be smaller as time is shorter and temperature is lower. Due to the increase in the threshold voltage depending on the drift characteristic, the memory cell may not be turned on during the normal write operation.

The rewrite operation may be a write operation including a select voltage apply period for turning on the memory cell and a write voltage apply period. During the select voltage apply period, the control logic 140 may turn on a memory cell that is not turned on at a voltage having the same polarity by applying a voltage, having a polarity opposite to that of a write voltage corresponding to the state determined depending on data desired to be written, as a select voltage. Thereafter, the control logic 140 may apply the write voltage, corresponding to the state determined depending on the data desired to be written, to the word line and the bit line.

Considering a problem in which a memory cell is not turned on during a normal write operation due to the increase in the threshold voltage of the memory cell depending on the drift characteristic, performing all write operations as rewrite operations may be the surest write operation method. However, because the rewrite operation may result in high power consumption and performance deterioration compared to the normal write operation, the memory device 100 may need to selectively use the rewrite operation only under a specific condition.

An embodiment of the present disclosure provides a scheme for checking the status of memory cells and selectively performing a rewrite operation after performing a normal write operation.

In detail, the control logic 140 may control the word line controller 120 and the bit line controller 130 to apply a read voltage to the memory cells so as to check the status of the memory cells after performing the normal write operation. The following Table 2 shows the polarities of read voltages applied to the memory cells during a read operation.

TABLE 2

| Memory cell logic state | Bit line voltage | Word line voltage | Sensed result |
|---|---|---|---|
| set state | + | − | On-cell |
| reset state | | | Off-cell |

Referring to Table 2, the control logic 140 may control the word line controller 120 and the bit line controller 130 to apply a positive voltage to the corresponding bit line and apply a negative voltage to the corresponding word line during the read operation, regardless of the writing state of each memory cell. After the read voltages are applied, the sense AMP included in the bit line controller 130 may sense the status of each memory cell. When the memory cell is in a set state, the result of sensing the memory cell may indicate that the memory cell is detected as an on-cell as a result of performing the read operation. The memory cell that is the on-cell indicates that it is turned on depending on the read voltages, and may be identified as the state of logic "1". When the memory cell is in a reset state, the result of sensing the memory cell may indicate that the memory cell is detected as an off-cell as a result of performing the read operation. The memory cell that is the off-cell indicates that it is turned off depending on the read voltages, and may be identified as the state of logic "0".

Based on the result of performing the read operation, a rewrite operation may be performed. Various embodiments of a scheme for performing the rewrite operation will be described in detail with reference to FIGS. 7 to 12, described later.

Figure 3:
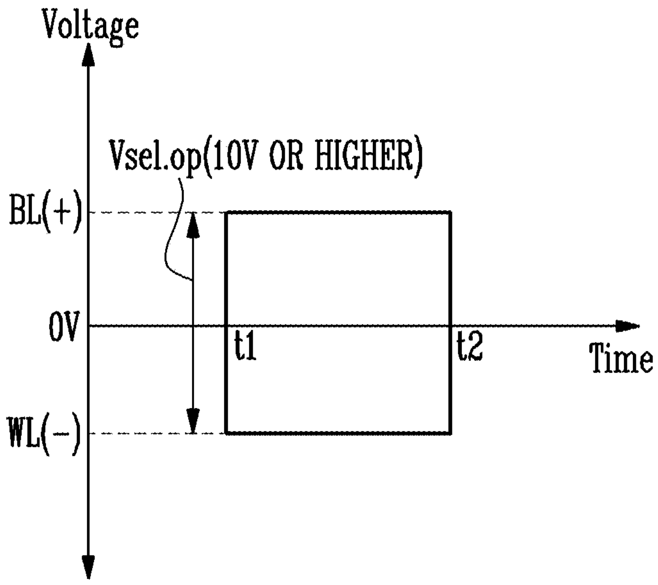
FIG. 3 is a diagram illustrating write voltages for writing a set state.

FIG. 3 is a diagram illustrating write voltages for writing a set state.

Figure 4:
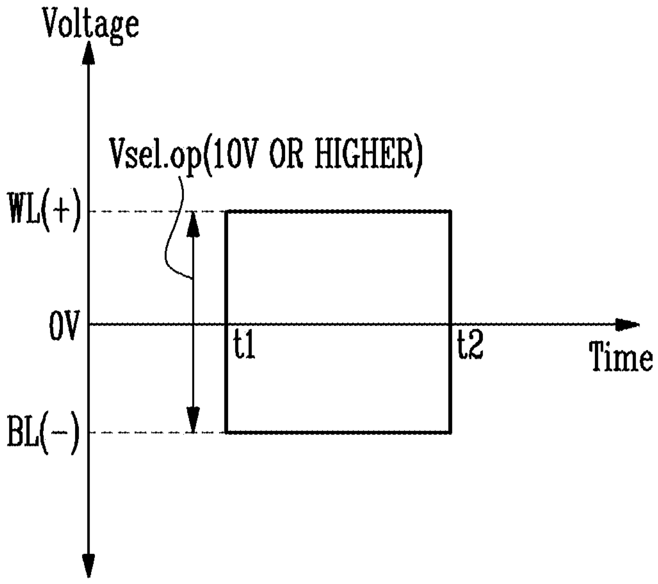
FIG. 4 is a diagram illustrating write voltages for writing a reset state.

FIG. 4 is a diagram illustrating write voltages for writing a reset state.

Referring to FIGS. 3 and 4, voltages applied to a word line and a bit line during a normal write operation are depicted. In detail, during the normal write operation, write voltages may be respectively applied to a bit line and a word line of each memory cell. The magnitude of the write voltages applied to the bit line and the word line may be a write reference voltage Vsel.op.

During a period t1 to t2, the control logic 140 described above with reference to FIG. 2 may control the bit line controller 130 and the word line controller 120, respectively, to apply a positive voltage to the bit line and apply a negative voltage to the word line (see FIG. 3). On the other hand, in order to write the reset state to the memory cell, the control logic 140 may control the bit line controller 130 and the word line controller 120, respectively, to apply a negative voltage to the bit line and apply a positive voltage to the word line (see FIG. 4). Here, the magnitude of the voltages applied to the bit line and the word line may be a write reference voltage Vsel.op. In an embodiment, the magnitude of the write reference voltage Vsel.op may be 10 V or higher.

Figure 5:
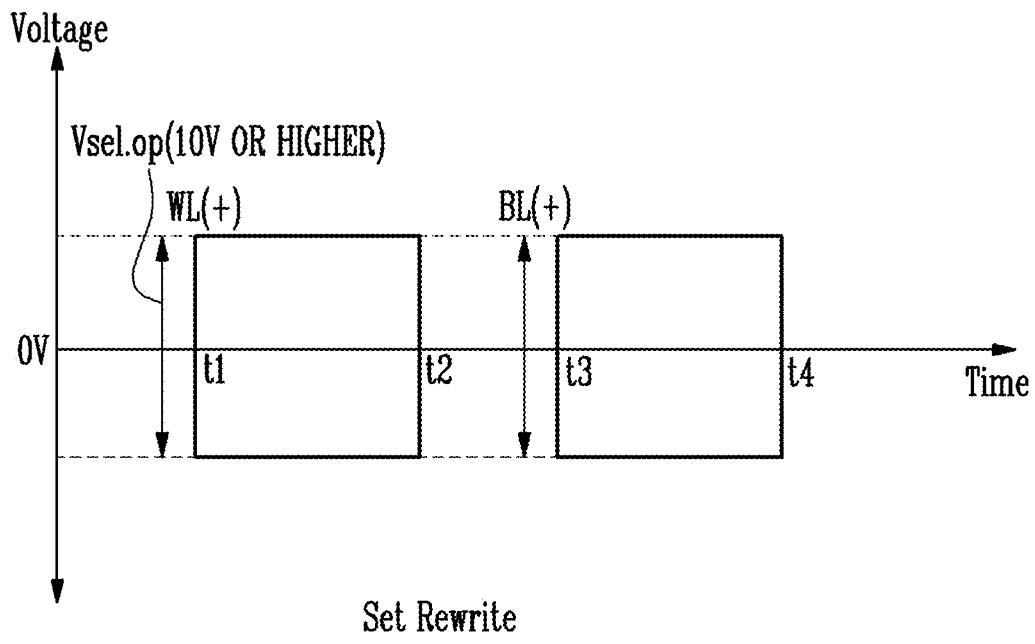
FIG. 5 is a diagram illustrating voltages applied during a rewrite operation of writing a set state.

FIG. 5 is a diagram illustrating voltages applied during a rewrite operation of writing a set state.

Figure 6:
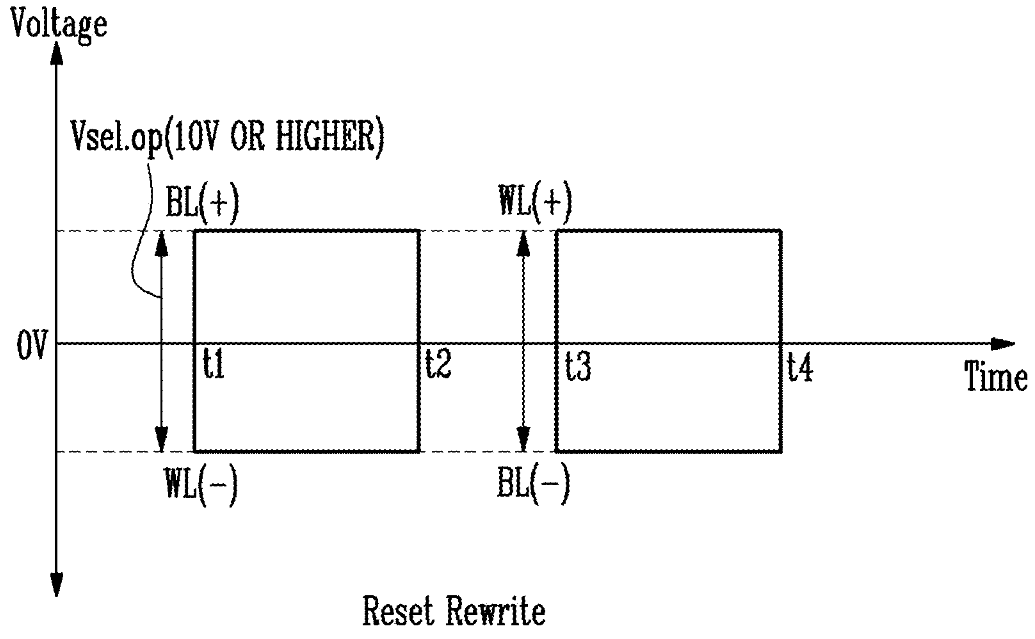
FIG. 6 is a diagram illustrating voltages applied during a rewrite operation of writing a reset state.

FIG. 6 is a diagram illustrating voltages applied during a rewrite operation of writing a reset state.

Referring to FIGS. 5 and 6, the rewrite operation may include a select voltage apply period t1 to t2 for turning on a memory cell and a write voltage apply period t3 to t4. During the select voltage apply period t1 to t2, the control logic 140 described above with reference to FIG. 2 may turn on a memory cell that is not turned on by a voltage at the same polarity by applying a voltage, having a polarity opposite to that of a write voltage corresponding to the state determined depending on data desired to be written, as the select voltage. In detail, in order to perform the rewrite operation for the set state, the control logic 140 may respectively control the bit line controller 130 and the word line controller 120 to apply a negative voltage to the bit line and apply a positive voltage to the word line during the period t1 to t2 (see FIG. 5). On the other hand, in order to perform the rewrite operation for the reset state, the control logic 140 may respectively control the bit line controller 130 and the word line controller 120 to apply a positive voltage to the bit line and apply a negative voltage to the word line during the period t1 to t2 (see FIG. 6).

Thereafter, the control logic 140 may apply a write voltage (voltage applied during the normal write operation) corresponding to a state determined depending on data desired to be written, to the word line and the bit line during the write voltage apply period t3 to t4.

In detail, when the rewrite operation for the set state is performed, the control logic 140 may respectively control the bit line controller 130 and the word line controller 120 to apply a positive voltage to the bit line and apply a negative voltage to the word line during the period t3 to t4 (see FIG. 5). On the other hand, when the rewrite operation for the reset state is performed, the control logic 140 may respectively control the bit line controller 130 and the word line controller 120 to apply a negative voltage to the bit line and apply a positive voltage to the word line during the period t3 to t4 (see FIG. 6).

Various embodiments of a scheme for performing the rewrite operation according to an embodiment of the present disclosure will be described in detail with reference to FIGS. 7 to 9 to be described below.

Figure 7:
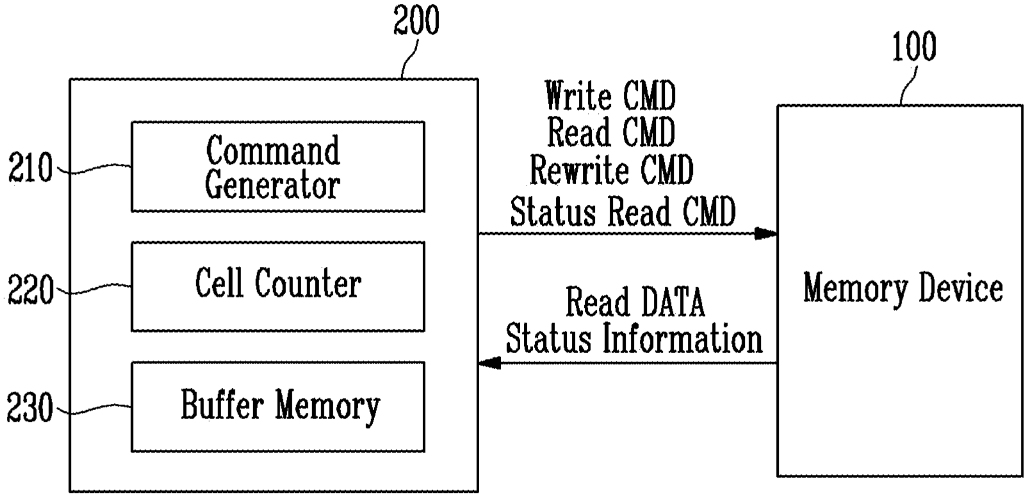
FIG. 7 is a diagram for describing an operation of a controller of FIG. 1, according to an embodiment of the present disclosure.

FIG. 7 is a diagram for describing an operation of the controller 200 of FIG. 1, according to an embodiment of the present disclosure.

Referring to FIG. 7, the controller 200 may include a command generator 210, a cell counter 220, and a buffer memory 230.

The command generator 210 may generate a command to be provided to the memory device 100 either in response to a request from the host 400, described with reference to FIG. 1, or regardless of the request from the host 400. The command generator 210 may provide the generated command to the memory device 100.

The cell counter 220 may count the number of on-cells or off-cells based on data received from the memory device 100.

The buffer memory 230 may temporarily store data to be provided to the memory device 100 or data received from the memory device 100. In an embodiment, the buffer memory 230 may temporarily store data received from the host 400 or data to be provided to the host 400. The buffer memory 230 may be a volatile memory.

The controller 200 according to an embodiment of the present disclosure may be operated depending on two methods.

A first method is a method in which the controller 200 directly determines and controls whether to perform a rewrite operation.

The command generator 210 may provide a write command Write CMD to the memory device 100 so as to perform a normal write operation. The memory device 100 may perform the normal write operation in response to the write command Write CMD provided by the controller 200.

Thereafter, the command generator 210 may provide a read command Read CMD to the memory device 100. The memory device 100 may perform a read operation in response to the read command Read CMD provided by the controller 200.

The controller 200 may receive read data Read DATA which is the result of the read operation performed by the memory device 100, and may store the read data in the buffer memory 230.

The cell counter 220 may count the number of off-cells based on the read data Read DATA received from the memory device 100. In detail, the read data Read DATA may include data “0” or “1”, and the number of “off-cells” may be obtained by counting the number of “0”s.

The command generator 210 may provide the memory device 100 with a rewrite command Rewrite CMD for performing a rewrite operation based on the result of counting the number of off-cells by the cell counter 220. For example, the command generator 210 may not provide the rewrite command Rewrite CMD to the memory device 100 when the number of off-cells is equal to or less than the reference number. On the other hand, the command generator 210 may provide the rewrite command Rewrite CMD to the memory device 100 when the number of off-cells is greater than the reference number.

In an embodiment, the reference number may be a value related to the number of error bits that can be corrected by an ECC processor (not illustrated) included in the controller 200. For example, the command generator 210 may control the memory device 100 not to perform the rewrite operation when, as a result of counting the number of off-cells by the cell counter 220, the counted number of off-cells is equal to or less than 70% of the number of error bits that can be corrected by the ECC processor (not illustrated). By means of this process, increased power consumption or deteriorated operational performance attributable to the performance of an unconditional rewrite operation may be prevented. In an embodiment, the value of 70% is a value that may vary depending on the implementation scheme, and the embodiment of the present disclosure is not limited to 70%.

The command generator 210 may provide the rewrite command Rewrite CMD to the memory device 100 so as to perform the rewrite operation when, as a result of counting the number of the off-cells by the cell counter 220, the counted number of off-cells is greater than 70% of the number of error bits that can be corrected by the ECC processor (not illustrated).

The number of “0”s (=number of off-cells) in the data sensed through the read operation may mean the sum of the number of memory cells read to be in a reset state and the number of cells failed in the normal write operation due to a factor such as a drift, among memory cells to be written in a set state. Therefore, the fact that the number of off-cells is greater than a certain reference number (e.g., 70% of the number of ECC-correctable error bits) may mean that, among memory cells to be written in the set state, the number of cells failed in the normal write operation is relatively large. Therefore, in this case, the performance of the write operation may be improved by controlling the memory device 100 to perform the rewrite operation.

A second method is a method in which the controller 200 is provided with the result of determining whether the memory device 100 requires a rewrite operation and in which the controller 200 simply, selectively provides a rewrite command Rewrite CMD to the memory device 100 depending on the result obtained by determining whether the memory device 100 requires the rewrite operation.

After the normal write operation progresses, the controller 200 may provide a status read command Status Read CMD to the memory device 100. The memory device 100 may provide status information that is data stored in a status register included therein to the controller 200 in response to the status read command Status Read CMD. The status information provided by the memory device 100 may include the result of performing the normal write operation. In an embodiment, the result of performing the normal write operation may be off-cell-related information indicating whether the number of off-cells sensed depending on the read voltage is greater than the reference number.

The command generator 210 may provide the memory device 100 with a rewrite command Rewrite CMD instructing a rewrite operation to be performed based on the off-cell-related information included in the status information. The second method is advantageous in that, compared to the first method, computations or calculations to be performed by the controller 200 may be reduced.

Figure 8:
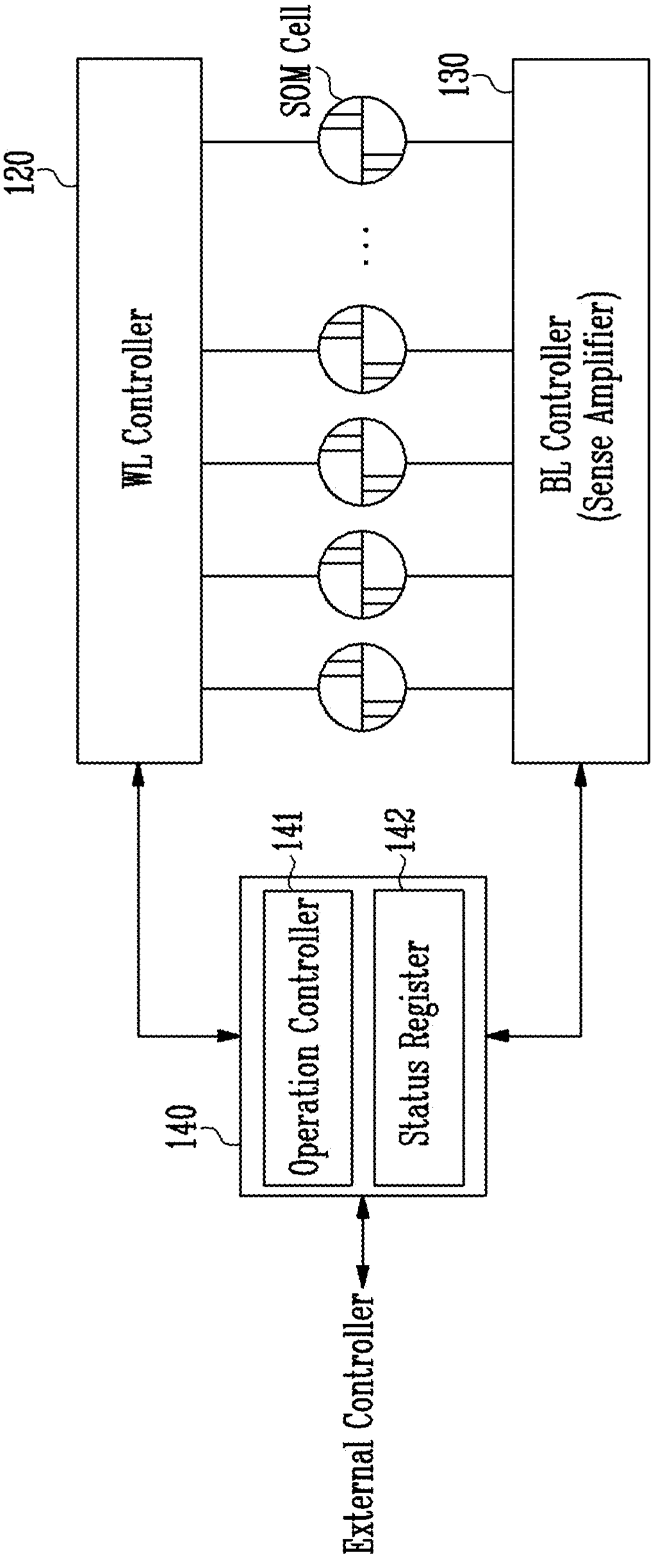
FIG. 8 is a diagram for describing an operation of the memory device of FIG. 1, according to an embodiment of the present disclosure.

FIG. 8 is a diagram for describing an operation of the memory device 100 of FIG. 1, according to an embodiment of the present disclosure.

Referring to FIG. 8, the control logic 140, described above with reference to FIG. 2, may include an operation controller 141 and a status register 142.

The operation controller 141 may control the operation of the memory device 100. In detail, the operation controller 141 may perform an operation on SOM cells that are memory cells by controlling a word line controller 120 and a bit line controller 130.

The operation controller 141 may control the word line controller 120 and the bit line controller 130 to perform a normal write operation in response to a normal write command received from an external controller.

In an embodiment, the operation controller 141 may store the result of performing the normal write command in the status register 142.

The operation controller 141 may control the word line controller 120 and the bit line controller 130 to perform a read operation in response to a read command received from the external controller.

According to an embodiment of the present disclosure, the operation controller 141 may control the word line controller 120 and the bit line controller 130 to sense memory cells using a read voltage even if a separate command is not provided from the external controller after the normal write command is performed. The operation controller 141 may count the number of “0”s included in the sensed result, and may store information, indicating whether the number of “0”s is equal to or less than a preset reference number, in the status register 142. For this, although not illustrated in the drawing, the control logic 140 may further include a counter circuit and a comparison circuit.

According to an embodiment of the present disclosure, the operation controller 141 may sense memory cells using the read voltage even if a separate command is not provided from the external controller after the normal write command is performed. Thereafter, the operation controller 141 may count the number of "0"s included in a sensed result, and may independently perform a rewrite operation even if a separate command is not provided from the external controller when the number of "0"s is greater than the preset reference number.

Figure 9:
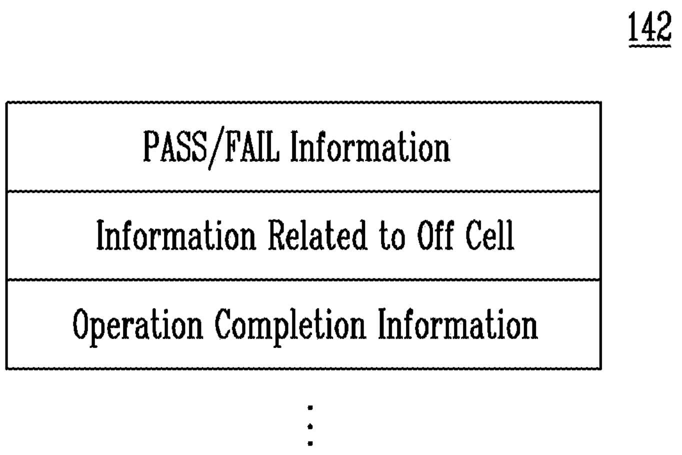
FIG. 9 is a diagram for describing status information stored in a status register of FIG. 8, according to an embodiment of the present disclosure.

FIG. 9 is a diagram for describing the status information stored in the status register of FIG. 8, according to an embodiment of the present disclosure.

Referring to FIG. 9, the status register may include pass/fail information, off-cell-related information, and operation completion information.

The pass/fail information may indicate whether an operation performed by the memory device has passed or failed.

The operation completion information may indicate whether the memory device has completed the performance of the corresponding operation.

The off-cell-related information may indicate whether the number of pieces of data indicating off-cells, among pieces of data included in the result of sensing using a read voltage after a normal write operation is performed, is greater than the reference number. Here, the reference number may be set or changed under the control of the controller 200.

Figure 10:
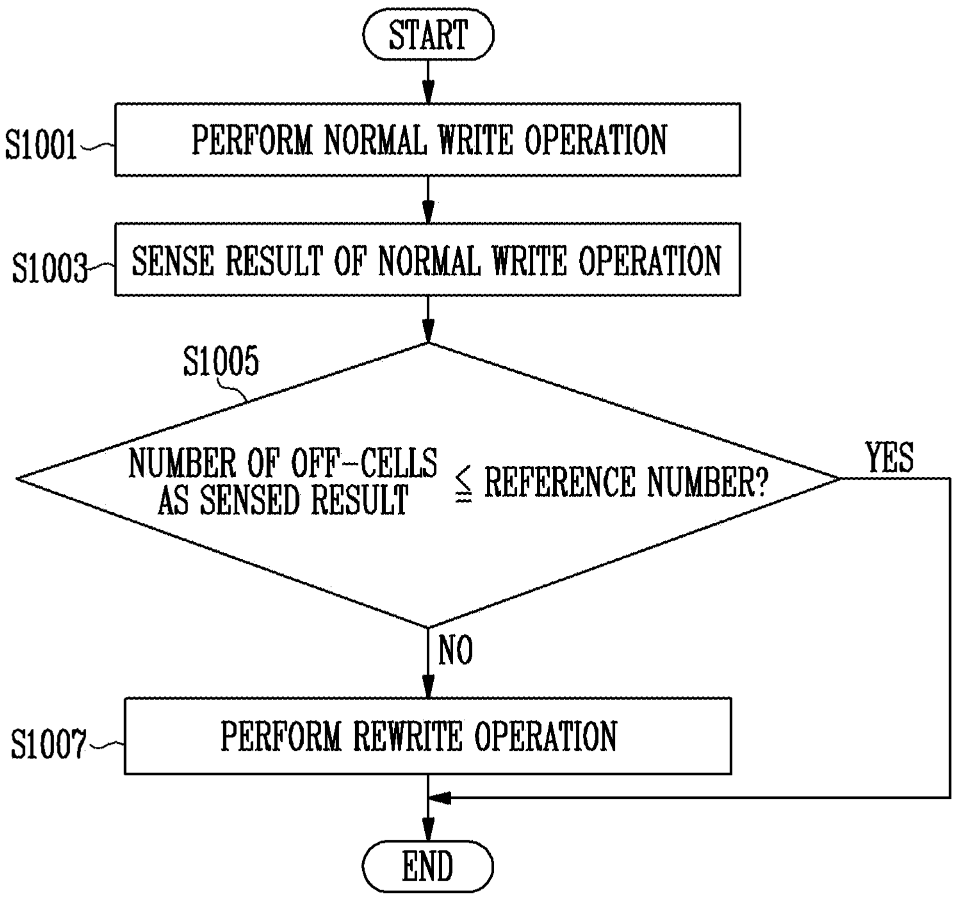
FIG. 10 is a flowchart for describing an operation of a data storage device according to an embodiment of the present disclosure.

FIG. 10 is a flowchart for describing an operation of the data storage device 50 according to an embodiment of the present disclosure.

At operation S1001, the data storage device 50 may perform a normal write operation.

At operation S1003, the data storage device 50 may sense the result of the normal write operation performed at the operation S1001. In detail, the data storage device 50 may sense memory cells on which the normal write operation has been performed by using a read voltage.

At operation S1005, the data storage device 50 may determine whether the number of off-cells included in a sensed result is equal to or less than a reference number. When it is determined that the number of off-cells included in the sensed result is equal to or less than the reference number (i.e., 'YES' in the operation S1005), the process may be terminated without a rewrite operation being performed. When it is determined that the number of off-cells included in the sensed result is greater than the reference number (i.e., 'NO' in the operation S1005), the data storage device 50 may proceed to operation S1007.

At the operation S1007, the data storage device 50 may perform a rewrite operation. The rewrite operation may be an operation of providing a select voltage, having a polarity opposite to that of a write voltage corresponding to a target state in the normal write operation, to a plurality of memory cells, and thereafter providing the write voltage corresponding to the target state.

Figure 11:
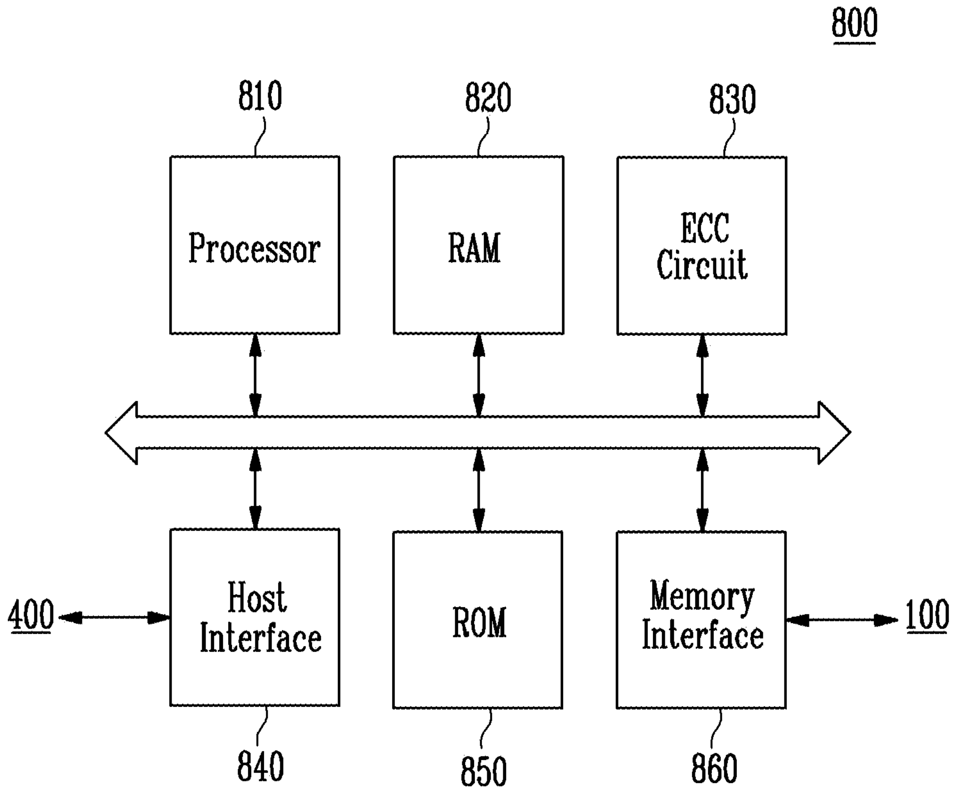
FIG. 11 is a diagram illustrating a configuration of a controller according to an embodiment of the present disclosure.

FIG. 11 is a diagram illustrating a configuration of a memory controller 800 according to an embodiment of the present disclosure.

Referring to FIG. 11, the memory controller 800 may include a processor 810, a random access memory (RAM) 820, an error correction (ECC) circuit 830, a host interface 840, a read only memory (ROM) 850, and a memory interface 860. The memory controller 800 may be the controller 200 described above with reference to FIG. 1.

The processor 810 may control the overall operation of the memory controller 800. The RAM 820 may be used as a buffer memory, a cache memory or a working memory of the memory controller 800. The command generator 210 and the cell counter 220, described above with reference to FIG. 7, may be stored in the ROM 850 or the RAM 820 in the form of software executed by the processor 810.

The ROM 850 may store various types of information required for operating the memory controller 800 in the form of firmware.

The memory controller 800 may communicate with an external device (e.g., the host 400, an application processor or the like) through the host interface 840.

The memory controller 800 may communicate with the memory device 100 through the memory interface 860. The memory controller 800 may transmit a command CMD, an address ADDR, a control signal CTRL, or the like to the memory device 100 and receive data DATA from the memory device 100, through the memory interface 860.

Figure 12:
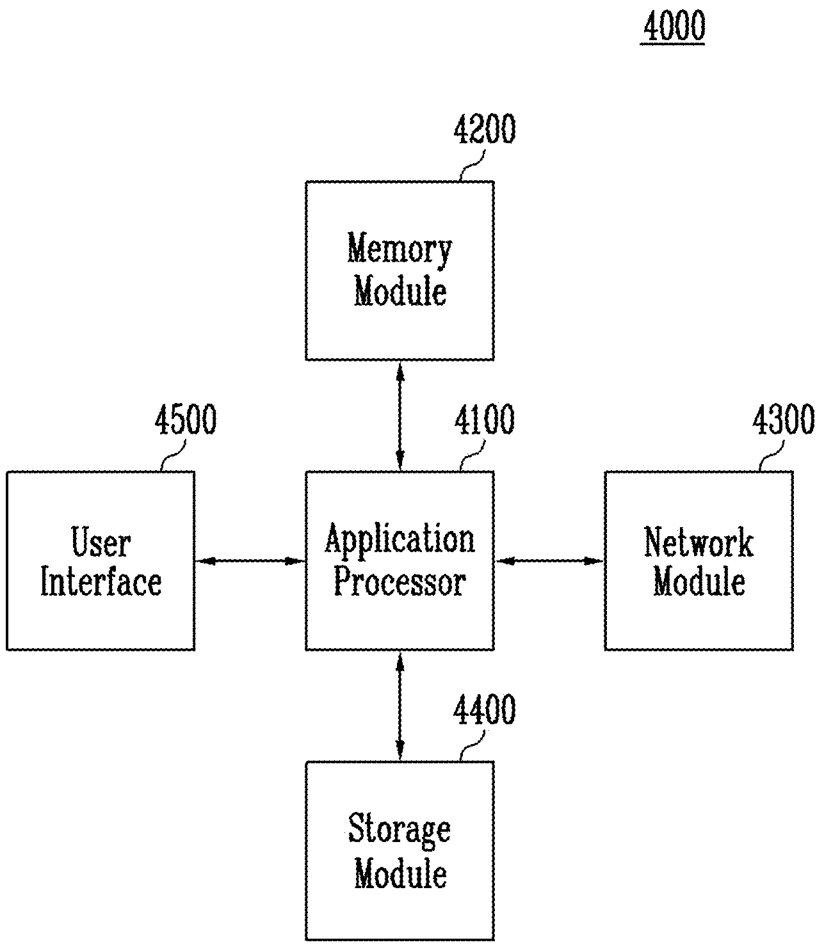
FIG. 12 is a diagram illustrating a configuration of a user system to which the data storage device according to an embodiment of the present disclosure is applied.

FIG. 12 is a diagram illustrating a configuration of a user system to which the data storage device 50 according to an embodiment of the present disclosure is applied.

Referring to FIG. 12, a user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be formed of a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM or nonvolatile RAMs such as PCM, ReRAM, MRAM, and FRAM. In an embodiment, the application processor 4100 and the memory module 4200 may be packaged based on a package-on-package (POP), and may then be provided as a single semiconductor package.

The network module 4300 may communicate with external devices. In an embodiment, the network module 4300 may support wireless communication, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, or Wi-Fi. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be the data storage device 50, described above with reference to FIG. 1. Alternatively, in various embodiments, the storage module 4400 may be provided as a removable storage medium (removable drive), such as a memory card or an external drive of the user system 4000.

In an embodiment, the storage module 4400 may include a plurality of nonvolatile memory devices, each of which may be operated in the same manner as the memory device 100, described above with reference to FIG. 1. The storage module 4400 may be operated in the same manner as the data storage device 50, described above with reference to FIG. 1.

The user interface 4500 may include interfaces which input data or instructions to the application processor 4100 or output data to external devices. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

Embodiments of the present disclosure may provide a data storage device having improved write operation performance.

While the present disclosure has been illustrated and described with respect to specific embodiments, the disclosed embodiments are provided for description, and are not intended to be restrictive. Further, it is noted that the embodiments of the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. A memory device comprising:

a plurality of memory cells; and an operation controller configured to perform a normal write operation of applying a write voltage corresponding to a target state, that is one of a set state and a reset state, to the plurality of memory cells, and to selectively perform a rewrite operation based on a result of the normal write operation, wherein the rewrite operation is an operation of providing, to the plurality of memory cells, a select voltage having a polarity opposite to a polarity of the write voltage corresponding to the target state, and providing the write voltage corresponding to the target state, wherein the operation controller is configured to provide, after the normal write operation, a read voltage to the plurality of memory cells through bit lines and word lines coupled to the plurality of memory cells and sense the plurality of memory cells depending on the read voltage, wherein the memory device further comprises a status register configured to store information about the result of the normal write operation, wherein the information about the result of the normal write operation includes information indicating whether a number of off-cells, among the plurality of memory cells sensed depending on the read voltage, is greater than a reference number, wherein the off-cells are memory cells that are turned off depending on the read voltage, among the plurality of memory cells, and wherein the number of off-cells includes first memory cells having the set state as the target state and sensed as the off-cells and second memory cells having the reset state as the target state and sensed as the off-cells.

2. The memory device according to claim 1, wherein the operation controller, during the normal write operation, is configured to apply a negative voltage to a word line of the word lines coupled to a first memory cell of the first memory cells having the set state as the target state, and to apply a positive voltage to a bit line of the bit lines coupled to the first memory cell.

3. The memory device according to claim 2, wherein the select voltage includes the positive voltage applied to the word line and the negative voltage applied to the bit line.

4. The memory device according to claim 1, wherein the operation controller, during the normal write operation, is configured to apply a positive voltage to a word line of the word lines coupled to a second memory cell of the second memory cells having the reset state as the target state, and to apply a negative voltage to a bit line of the bit lines coupled to the second memory cell.

5. The memory device according to claim 1, wherein the operation controller is configured to provide the result of the normal write operation to an external controller in response to a request from the external controller.

6. The memory device according to claim 1, wherein the operation controller is configured to provide the information about the result of the normal write operation, stored in the status register, to an external controller in response to a request from the external controller.

7. The memory device according to claim 1, wherein each of the plurality of memory cells contains an amorphous chalcogenide-based material.

8. The memory device according to claim 1, wherein the operation controller is configured to provide the read voltage by applying a positive voltage to the bit lines and applying a negative voltage to the word lines.

9. A data storage device comprising:

a memory device including a plurality of memory cells, the memory device configured to perform a normal write operation of writing data to the plurality of memory cells and after the normal write operation, apply a read voltage to the plurality of memory cells through bit lines and word lines coupled to the plurality of memory cells to generate a sensed result indicating on-cells and off-cells; and a controller configured to provide a rewrite command instructing the data to be rewritten to the memory device based on the sensed result, wherein the memory device is, in response to the rewrite command, configured to provide, to the plurality of memory cells, a select voltage having a polarity opposite to a polarity of a write voltage corresponding to a target state that is one of a set state and a reset state, and provide the write voltage corresponding to the target state, wherein the controller comprises:

a cell counter configured to receive the sensed result and count a number of off-cell indications included in the sensed result; and a command generator configured to provide the rewrite command to the memory device based on whether the number of off-cell indications is greater than a reference number, wherein the off-cells are memory cells that are turned off depending on the read voltage among the plurality of memory cells.

10. The data storage device according to claim 9, wherein the controller is configured to provide a status read command to the memory device and receive a result of the normal write operation as a response to the status read command from the memory device.

11. The data storage device according to claim 9, wherein the controller is configured to, after the normal write operation is performed, provide a read command to the memory device and receive a result of the normal write operation as a response to the read command.

12. The data storage device according to claim 9, wherein each of the plurality of memory cells contains an amorphous chalcogenide-based material.

13. A memory device comprising:

a plurality of memory cells; and an operation controller configured to:

perform a normal write operation on the plurality of memory cells;

after the normal write operation, apply a read voltage to the plurality of memory cells through bit lines and word lines coupled to the plurality of memory cells to generate a sensed result indicating on-cells and off-cells;

determine whether a number of off-cells indicated by the sensed result is greater than a reference number; and perform a rewrite operation in response to the number of off-cells being greater than the reference number, wherein the rewrite operation comprises providing, to the plurality of memory cells, a select voltage having a polarity opposite to a polarity of a write voltage corresponding to a target state that is one of a set state and a reset state, and providing the write voltage corresponding to the target state, wherein the off-cells are memory cells that are turned off depending on the read voltage, among the plurality of memory cells.

14. The memory device according to claim 13, wherein the operation controller is, during the rewrite operation, configured to apply a positive voltage to a word line of the word lines coupled to a first memory cell having the set state as the target state, among the plurality of memory cells, apply a negative voltage to a bit line of the bit lines coupled to the first memory cell, and apply a negative voltage to the word line coupled to the first memory cell and apply a positive voltage to the bit line coupled to the first memory cell.

15. The memory device according to claim 13, wherein the operation controller is, during the rewrite operation, configured to apply a negative voltage to a word line of the word lines coupled to a second memory cell having the reset state as the target state, among the plurality of memory cells, apply a positive voltage to a bit line of the bit lines coupled to the second memory cell, and apply a positive voltage to the word line coupled to the second memory cell and apply a negative voltage to the bit line coupled to the second memory cell.

16. The memory device according to claim 13, wherein each of the plurality of memory cells contains an amorphous chalcogenide-based material.

* * * * *